US008436663B2

(12) United States Patent
Spits et al.

(10) Patent No.: US 8,436,663 B2
(45) Date of Patent: May 7, 2013

(54) LOW-CURRENT INPUT BUFFER

(75) Inventors: Erwin Spits, Utrecht (NL); Léon C. M. van den Oever, Rosmalen (NL)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/322,367

(22) PCT Filed: Jun. 21, 2010

(86) PCT No.: PCT/EP2010/058743
§ 371 (c)(1), (2), (4) Date: Jan. 24, 2012

(87) PCT Pub. No.: WO2010/149629
PCT Pub. Date: Dec. 29, 2010

(65) Prior Publication Data

US 2012/0112801 A1 May 10, 2012

(30) Foreign Application Priority Data

Jun. 22, 2009 (EP) .................................... 09163406

(51) Int. Cl.
*H03K 3/00* (2006.01)

(52) U.S. Cl.
USPC ................ 327/109; 327/77; 327/89; 327/407

(58) Field of Classification Search .................. 327/108, 327/109, 77, 81, 89, 96, 403, 404, 407, 408, 327/415, 416
See application file for complete search history.

(56) References Cited

U.S. PATENT DOCUMENTS

| | | | | |
|---|---|---|---|---|
| 3,700,981 | A | 10/1972 | Masuhara et al. | |
| 3,775,693 | A | 11/1973 | Proebsting | |
| 4,978,904 | A | 12/1990 | Fitzpatrick et al. | |
| 5,091,662 | A * | 2/1992 | Yung et al. | 326/68 |
| 5,910,737 | A * | 6/1999 | Kesler | 327/89 |

FOREIGN PATENT DOCUMENTS

| | | | |
|---|---|---|---|
| EP | 0415768 | A2 | 3/1991 |
| GB | 1 436 988 | A | 5/1976 |
| JP | 61-161020 | A | 7/1986 |
| JP | 2-280413 | A | 11/1990 |

* cited by examiner

*Primary Examiner* — An Luu
(74) *Attorney, Agent, or Firm* — Slater & Matsil, L.L.P.

(57) ABSTRACT

A current-limited differential entry stage compares an input signal to a reference voltage generated by a current-limited transistor or diode configuration. Current limiters comprise a D-mode feedback transistor having a gate-source junction. The D-mode transistor is not conducting between the source and the drain if a gate-source voltage is more negative than a negative threshold voltage, and conducting between the source and the drain, otherwise a feedback connection connects the source of the D-mode feedback transistor to its gate via a component that generates a voltage drop.

20 Claims, 2 Drawing Sheets

LOW-CURRENT INPUT BUFFER

This patent application is a national phase filing under section 371 of PCT/EP2010/058743, filed Jun. 21, 2010, which claims the priority of European patent application 09163406.3, filed Jun. 22, 2009, each of which is incorporated herein by reference in its entirety.

TECHNICAL FIELD

This invention relates to low-current input buffers compatible with CMOS levels for applications in GaAs technology.

BACKGROUND

Conventional logic circuits in GaAs technology use a transistor in combination with a large resistor. These circuits require both high input drive currents and high currents in the on-state because of the required voltage drop over the resistor. Furthermore, the resistor occupies a large chip area to provide the desired large resistance.

SUMMARY OF THE INVENTION

In one aspect, this invention provides a low-current input buffer which is compatible with CMOS levels and can be realized in GaAs technology.

The low-current input buffer comprises a current-limited differential entry stage comparing an input signal to a reference voltage, which is generated by a current-limited transistor or diode configuration. The current-limited components of the input buffer are each provided with a current limiter and can be realized in GaAs technology. Various components available in this technology, especially merged or stacked FET-HBT integration schemes, often called BiFET or BiHEMT and containing both HBT and FET or P-HEMT devices on a single GaAs substrate, can be used in the circuit.

The low-current input buffer makes use of E-mode (enhancement) and D-mode (depletion) transistors comprising a source, a drain and a gate controlling a channel between source and drain and further comprising a gate-source junction and/or a gate-drain junction. The transistors can be symmetric with respect to source and drain, so that a gate-source junction and a similar gate-drain junction are available. An E-mode transistor is conducting between the source and the drain if the gate-source voltage is more positive than a positive threshold voltage and is not conducting between the source and the drain if the gain-source voltage is lower. A D-mode transistor is not conducting between the source and the drain if the gate-source voltage is more negative than a negative threshold voltage and is conducting between the source and the drain in the case of a gate-source voltage above the threshold voltage (less negative, zero or positive).

A current limiter is connected between a current-limited component and a voltage level of a supply voltage. The current limiters comprise a D-mode feedback transistor and a feedback loop connecting the source of the D-mode feedback transistor to the gate of the D-mode feedback transistor via a component that generates a voltage drop. The component generating a voltage drop can comprise at least one E-mode transistor or a diode formed by the basis and the emitter or collector of a bipolar transistor or a heterobipolar transistor.

The differential entry stage can be provided with a current source that is connected between the differential circuit and a voltage level of the supply voltage. The current source can be used within a current minor to connect the differential entry stage with a current-limited control circuit. The control circuit may be used to switch the whole input buffer on and off.

In an embodiment of the low-current input buffer, the differential entry stage is formed with a first E-mode transistor, a second E-mode transistor, a first D-mode transistor and a second D-mode transistor. The gate of the first E-mode transistor is provided as an input, and the drain of the second E-mode transistor is provided as an output. The drain of the first E-mode transistor is connected to the source of the first D-mode transistor. The gate of the second E-mode transistor is connected to a component generating a reference voltage. A component generating a voltage drop is connected between the drain of the second E-mode transistor and the source of the second D-mode transistor. The drain of the second E-mode transistor is connected with the gates of the first and second D-mode transistors. The drains of the first and second D-mode transistors are to be connected to a high voltage level $V_{DD}$ of a supply voltage, and the sources of the first and second E-mode transistors are connected to a current source. The current source can be provided by a third E-mode transistor, the source of which is connected to a low voltage level of the supply voltage and the drain of which is connected to the sources of the first and second E-mode transistors. The gate of the third E-mode transistor may be addressed by a control circuit.

In a further embodiment, a current minor is connected to the sources of the first and second E-mode transistors. The current mirror comprises a current source, which can be provided, for instance, by a third E-mode transistor, the source of which is connected to a low voltage level of the supply voltage and the drain of which is connected to the sources of the first and second E-mode transistors. The current mirror further comprises a current-limited control circuit connected to the gate of the third E-mode transistor. The control circuit comprises a reference current source, which can be provided, for instance, by a further E-mode transistor, the source of which is connected to the low voltage level of the supply voltage and the drain of which is short-circuited to its gate. The drain is also connected to a high level of the supply voltage via an optional voltage shift member and a current limiter. The voltage shift member can be provided, for instance, by a second further E-mode transistor, the source of which is connected to the drain of the first further E-mode transistor and the drain of which is short-circuited to its gate. The current limiter comprises a further D-mode feedback transistor and a feedback loop connecting the source of the further D-mode feedback transistor to the gate of the further D-mode feedback transistor via a component that generates a voltage drop. If a voltage shift member is formed by a second further E-mode transistor, the drain of the second further E-mode transistor is connected to the gate of the further D-mode feedback transistor. Otherwise the reference current source, particularly the drain of its further E-mode transistor, is connected to the gate of the further D-mode feedback transistor. The high level of the voltage can be the voltage level that is to be connected to the drains of the first and second D-mode transistors. The connection of the control circuit to the high level of the voltage can be made switchable, similar to the application of an enable voltage which switches the entire circuit on and off.

In a further embodiment of the low-current input buffer, a current-limited inverter circuit is used as an output stage. The output signal of the differential entry stage described above or the output signal of a successive circuit stage is used as an input signal of the current-limited inverter circuit. The inverter circuit is provided with a current-limiter comprising a D-mode feedback transistor and a feedback loop connecting the source of the D-mode feedback transistor to the gate of the D-mode feedback transistor via a component that generates a voltage drop. The inverter circuit can further comprise an E-mode input transistor. The component that generates a voltage drop is connected between the drain of the E-mode input transistor and the source of the D-mode feedback transistor. The drain of the input transistor is also connected to the gate of the feedback transistor. The supply voltage is to be applied to the source of the input transistor and the drain of the feedback transistor, the drain of the feedback transistor being supplied with the high voltage level of the supply voltage. The gate of the input transistor is provided for an input signal, and the drain of the input transistor is provided for an output signal. The component that generates a voltage drop can advantageously be provided by a diode of a bipolar transistor or a heterobipolar transistor. An inverter circuit of this latter design is especially suitable as an output stage of the input buffer to drive a high-impedance load like a depletion-mode FET or a depletion-mode P-HEMT, for example.

In a further embodiment, the reference voltage is generated by a current-limited component that generates a voltage drop. It is switched between a voltage level of the supply voltage and a further current-limiter, the current-limiter comprising a D-mode feedback transistor, a feedback loop and a further component generating a voltage drop in the feedback loop.

BRIEF DESCRIPTION OF THE DRAWINGS

These and other features and advantages of the low-current input buffer will become apparent from the following detailed description of examples in conjunction with the appended figures.

Figure 1:
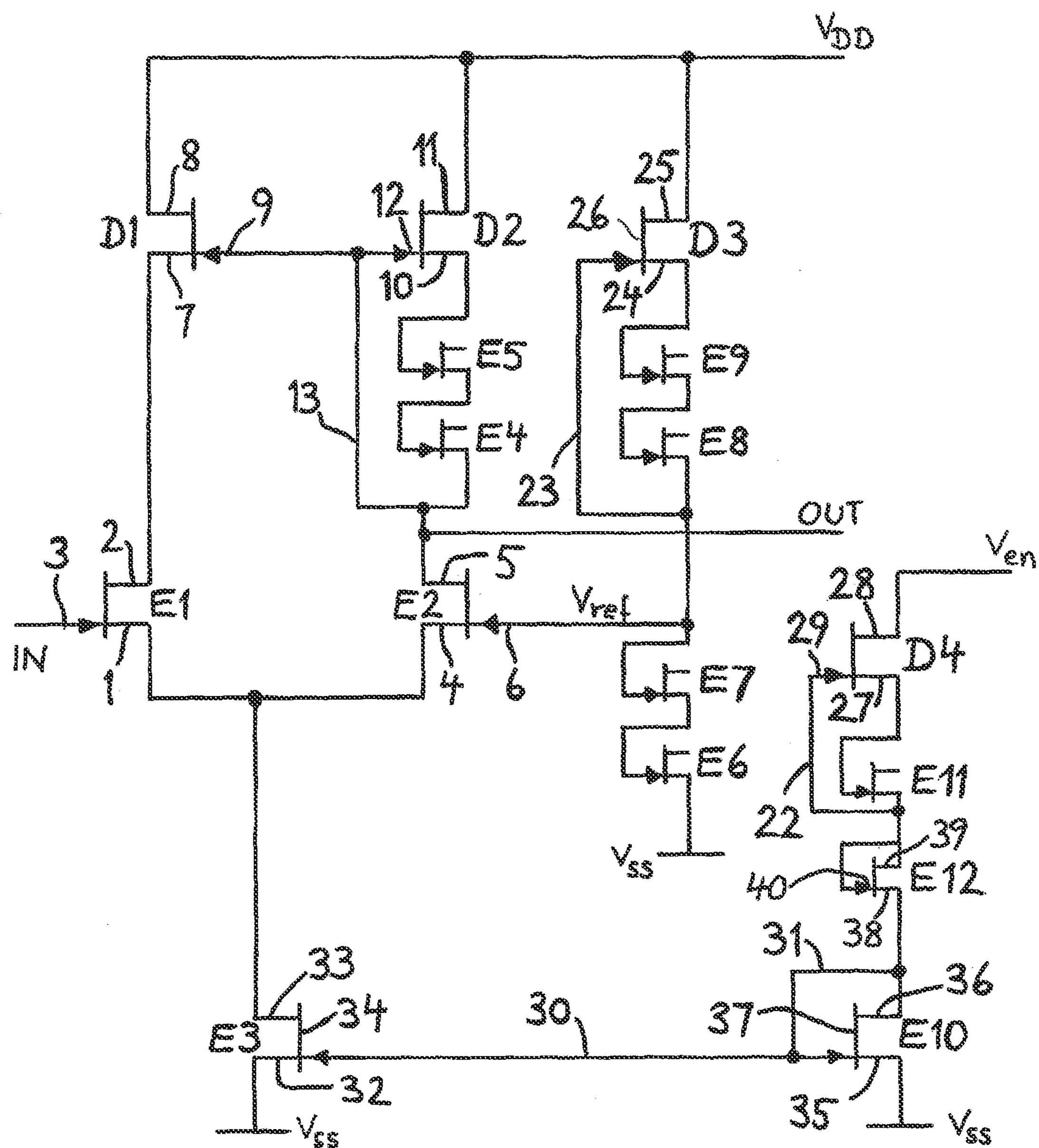
FIG. 1 shows a circuit diagram of an embodiment of the low-current input buffer.

The following list of reference symbols may be used in conjunction with the drawings:

1 source of the first E-mode transistor
2 drain of the first E-mode transistor
3 gate of the first E-mode transistor
4 source of the second E-mode transistor
5 drain of the second E-mode transistor
6 gate of the second E-mode transistor
7 source of the first D-mode transistor
8 drain of the first D-mode transistor
9 gate of the first D-mode transistor
10 source of the second D-mode transistor
11 drain of the second D-mode transistor
12 gate of the second D-mode transistor
13 feedback connection
14 further diode
15 source of the input transistor
16 drain of the input transistor
17 gate of the input transistor
18 source of the feedback transistor
19 drain of the feedback transistor
20 gate of the feedback transistor
21 feedback connection
22 feedback connection
23 feedback connection
24 source of the third D-mode transistor
25 drain of the third D-mode transistor
26 gate of the third D-mode transistor
27 source of the fourth D-mode transistor
28 drain of the fourth D-mode transistor
29 gate of the fourth D-mode transistor
30 connection
31 connection
32 source of the third E-mode transistor
33 drain of the third E-mode transistor
34 gate of the third E-mode transistor
35 source of the tenth E-mode transistor
36 drain of the tenth E-mode transistor
37 gate of the tenth E-mode transistor
38 source of the twelfth E-mode transistor
39 drain of the twelfth E-mode transistor
40 gate of the twelfth E-mode transistor
D feedback transistor
D1 first D-mode transistor
D2 second D-mode transistor
D3 third D-mode transistor
D4 fourth D-mode transistor
E input transistor
E1 first E-mode transistor
E2 second E-mode transistor
E3 third E-mode transistor
E4 fourth E-mode transistor
E5 fifth E-mode transistor
E6 sixth E-mode transistor
E7 seventh E-mode transistor
E8 eighth E-mode transistor
E9 ninth E-mode transistor
E10 tenth E-mode transistor
E11 eleventh E-mode transistor
E12 twelfth E-mode transistor
IN input
OUT output
$V_{DD}$ high potential level of a supply voltage
$V_{SS}$ low potential level of a supply voltage

DETAILED DESCRIPTION OF ILLUSTRATIVE EMBODIMENTS

FIG. 1 shows a circuit diagram of an embodiment of the low-current input buffer. The transistors appearing in the circuit are a kind of field-effect transistors comprising source, drain and gate as well as a diode formed by a junction between gate and source or drain. The transistors are therefore represented in the circuit diagram by symbols used for n-channel JFETs, but other types of transistors having a comparable structure can be used as well. In the examples shown in the figures, the gate-source junctions of the transistors are used.

The transistors designated with a D (D-mode, depletion mode) are characterized by a negative threshold voltage. If a gate-source voltage is applied that is more negative (which means negative and of a larger absolute value) than the negative threshold voltage, the source-drain path through the channel of the transistor is non-conducting. If the transistor is considered as a switch, the switch is open if the gate-source voltage is more negative than the threshold voltage. This type of transistor may therefore be characterized as "normally-on". If the gate-source voltage is not as negative as the threshold voltage or if it is zero or positive, the source-drain path is conducting and therefore the switch is closed.

The E-mode (enhancement mode) transistor is characterized by a positive threshold voltage. The E-mode transistors are conducting between source and drain if the gate-source voltage is larger than the positive threshold voltage and therefore the switch is closed. If the gate-source voltage is lower than the positive threshold voltage or if it is zero or negative, the transistor is non-conducting and therefore the switch is open. Thus, the E-mode transistors can be characterized as "normally-off".

The differential entry stage of the embodiment of the low-current input buffer shown in FIG. 1 comprises a first E-mode transistor E1, a second E-mode transistor E2, a first D-mode transistor D1, and a second D-mode transistor D2. An optional current source is provided by means of a third E-mode transistor E3. The source 32 of the third E-mode transistor E3 is connected to ground or to a low voltage level $V_{SS}$ of the supply voltage. The drain 33 of the third E-mode transistor E3 is connected to the source 1 of the first E-mode transistor E1 and to the source 4 of the second E-mode transistors E2. The drain 2 of the first E-mode transistor E1 is connected to the source 7 of the first D-mode transistor D1. The drain 5 of the second E-mode transistor E2 is connected to the source 10 of the second D-mode transistor D2.

The component that generates a voltage drop in the current limiter can be provided by a gate-source junction or by a gate-drain junction of a further E-mode transistor. The junctions of the further E-mode transistor may be switched in parallel by connecting source and drain. Gate-source junctions or gate-drain junctions of further E-mode transistors can be connected in series to obtain the adequate value of the voltage drop. Instead, the component that generates a voltage drop can be provided by a diode, especially a diode formed by the basis and the emitter or collector of a bipolar or heterobipolar transistor. In the embodiment shown in FIG. 1, the component that generates a voltage drop comprises the gate-source junctions of a fourth E-mode transistor E4 and a fifth E-mode transistor E5, connected in series between the source 10 of the second D-mode transistor D2 and the drain 5 of the second E-mode transistor E2.

The gate 12 of the second D-mode transistor D2 is connected to the gate 9 of the first D-mode transistor D1. The drain 8 of the first D-mode transistor D1 and the drain 11 of the second D-mode transistor D2 are connected to a high voltage level $V_{DD}$ of the supply voltage. The gate 3 of the first E-mode transistor E1 is provided for an input signal IN, and the drain 5 of the second E-mode transistor E2 is provided for an output signal OUT. The reference voltage $V_{ref}$ is applied to the gate 6 of the second E-mode transistor E2.

The configuration generating the reference voltage $V_{ref}$ comprises gate-source junctions of a sixth E-mode transistor E6 and of a seventh E-mode transistor E7, the gate-source junctions being connected in series. Instead, only one gate-source junction may be used, or the number of gate-source junctions of E-mode transistors connected in series may be larger than two. The gate-source junctions and the gate-drain junctions may also be switched parallel. Instead of gate-source or gate-drain junctions of E-mode transistors, other configurations of diodes, particularly diodes of bipolar or heterobipolar transistors, and/or transistors can be used to generate the desired reference voltage.

The configuration generating the reference voltage $V_{ref}$ is switched between a further current limiter and the low level $V_{SS}$ of the supply voltage. The further current limiter comprises a third D-mode transistor D3, a further component generating a voltage drop, and a feedback connection 23. The further component generating a voltage drop comprises an eighth E-mode transistor E8 and a ninth E-mode transistor E9 having their gate-source junctions connected in series. The component generating a voltage drop may be varied according to the above description of the current limiter of the differential entry stage.

The current source provided by the third E-mode transistor E3 may be part of a current mirror comprising the third E-mode transistor E3 and a tenth E-mode transistor (E10). The gate 34 of the third E-mode transistor E3 is connected to the gate 37 of the tenth E-mode transistor E10 by means of a further connection 30. The gate 37 and the drain 36 of the tenth E-mode transistor E10 are short-circuited by means of a further connection 31. The drain 36 of the tenth E-mode transistor E10 is connected to a further current limiter. This further current limiter comprises a fourth D-mode transistor D4, a further component generating a voltage drop, which is the gate-source junction of an eleventh E-mode transistor E11, and a further feedback connection 22. The component generating a voltage drop may be varied according to the above description of the current limiter of the differential entry stage. The feedback connection 22 connects the component generating a voltage drop with the gate 29 of the fourth D-mode transistor D4. The source 27 of the fourth D-mode transistor D4 is connected to the component generating the voltage drop, and the drain 28 of the fourth D-mode transistor D4 is connected to a voltage level $V_{en}$ of the supply voltage, which may be the high voltage level $V_{DD}$. If the drain 28 of the fourth D-mode transistor D4 is connected in a switchable manner to the voltage level, especially to an enable voltage $V_{en}$ provided in the circuitry, the input buffer can be switched on and off.

A voltage shift member can be connected between the drain 36 of the tenth E-mode transistor E10 and the current limiter comprising the eleventh E-mode transistor E11 and the fourth D-mode transistor D4. In the embodiment shown in FIG. 1, the voltage shift member is a twelfth E-mode transistor E12. The drain 36 of the tenth E-mode transistor E10 is connected to the source 38 of the twelfth E-mode transistor E12, and the drain 39 of the twelfth E-mode transistor E12 is short-circuited to its gate 40 and connected to the feedback connection 22. The source 35 of the tenth E-mode transistor E10 is connected to reference node $V_{SS}$.

Figure 2:
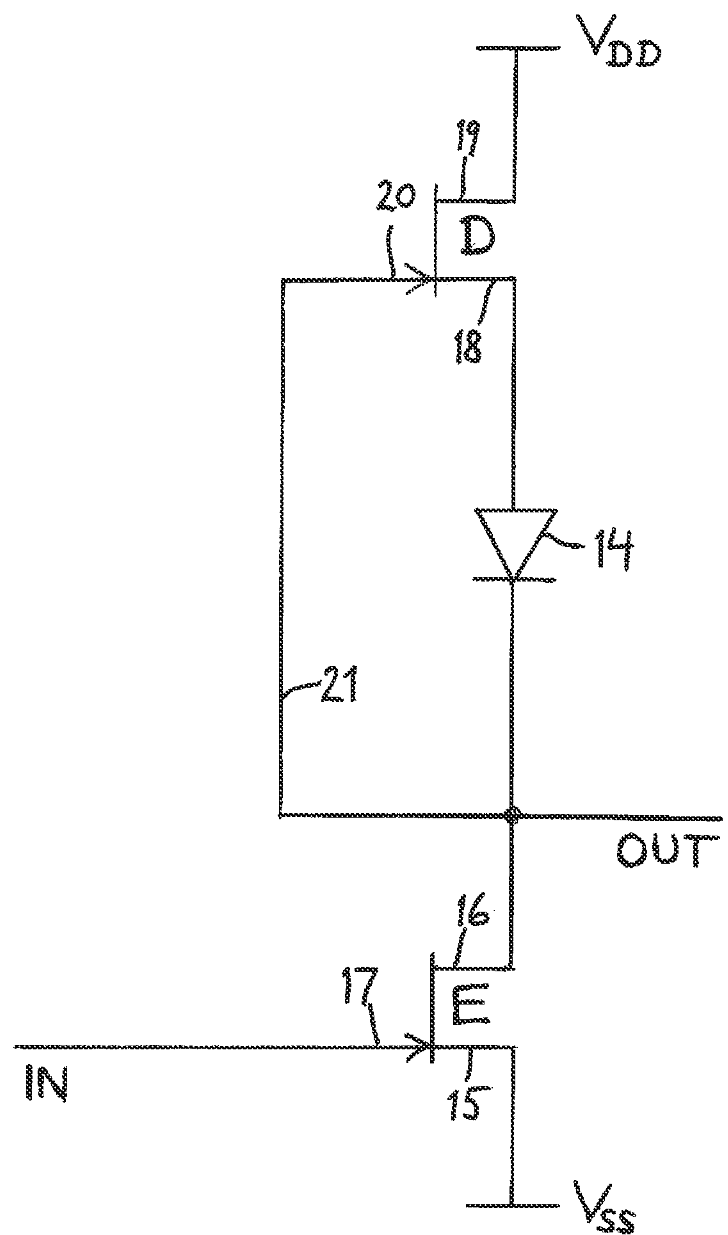
FIG. 2 shows a circuit diagram of a current-limited inverter circuit applied as an output stage of a further embodiment of the input buffer.

FIG. 2 shows a current-limited inverter circuit that is suitable to provide an output stage of the input buffer. In the following, the D-mode transistor D in the inverter circuit of FIG. 2 will be referred to as feedback transistor and the E-mode transistor E as input transistor. The source 15 of the input transistor E is connected to ground or the lower potential $V_{SS}$ of a supply voltage. The drain 16 of the input transistor E is provided for an output signal OUT. The gate 17 of the input transistor E is provided for an input signal IN, which can be the output signal of the differential entry stage or of at least one further stage that may be connected between the differential entry stage and the inverter circuit and can comprise, for instance, a logic circuit. The drain 16 of the input transistor E is connected via the feedback connection 21 with the gate 20 of the feedback transistor D. The drain 19 of the feedback transistor D is connected to the higher potential $V_{DD}$ of the supply voltage. The drain 16 of the input transistor E is connected with the source 18 of the feedback transistor D via a component generating a voltage drop. This component can be formed by gate-source junctions of further E-mode transistors or, as shown in FIG. 2, by a further diode 14 of a further transistor, which may be a bipolar or heterobipolar transistor. The use of a further diode 14 in the current-limiter of the inverter circuit may be advantageous in view of the requirements of circuit components that are driven by the output stage. The feedback transistor D, the component generating a voltage drop 14, and the feedback connection 21 are the current limiter of the inverter circuit. The operation of this circuit is as follows.

When a high voltage level is applied to the gate 17 of the input transistor E, which means a high logical input signal IN, this voltage will drive the input transistor E into a conducting mode. The corresponding switch between source and drain is therefore closed, and the ground potential $V_{SS}$ is connected with the gate 20 of the feedback transistor D. The voltage of the input signal IN only needs to be high enough for the gate-source voltage of the input transistor E to be larger than the threshold voltage of this transistor. The voltage over the component that generates the voltage drop 14 makes a current flow through the feedback transistor D and the input transistor E, thus causing a voltage drop, so that the voltage level at the gate 20 of the feedback transistor D is lower than the voltage level at the source 18 of the feed-back transistor D. The component that generates the voltage drop 14 is dimensioned in such a manner that the voltage drop causes the feedback transistor D to be switched to its sub-threshold region (the gate-source voltage of the feedback transistor D being comparable to the threshold voltage). Consequently, the current flowing through the feedback transistor D is very low, while the voltage level at the drain 16 of the input transistor E is essentially on ground level ($V_{SS}$). Thus the high input signal IN is transformed into a low output signal OUT.

When a low voltage level is applied to the gate 17 of the input transistor E, the gate-source voltage of the input transistor E is below its threshold voltage, so that the input transistor E is non-conducting, and almost no current flows through the source-drain path of the input transistor E. The only current through the feedback transistor D and the input transistor E is a very small current through the output OUT. The component that generates the voltage drop 14 is dimensioned in such a manner that the voltage drop is low enough for the negative gate-source voltage of the feedback transistor D to be above the more negative threshold voltage. Therefore the feedback transistor D is conducting between source and drain, and the corresponding switch is closed. Accordingly, the output signal OUT is on a high level. Thus the low input signal IN is transformed into a high output signal OUT, and this circuit therefore functions as a current-limited inverter.

The low-current input buffer is suitable to convert CMOS level inputs to levels usable in GaAs circuits without requiring high currents. Furthermore, an overall enable function can easily be implemented. The transistors that are applied in the input buffer can all be devices of a BiFET technology in GaAs. The input buffer is particularly useful to drive a high-impedance load, like a depletion-mode FET or a depletion-mode P-HEMT.

The invention claimed is:

1. A circuit, comprising:

a first E-mode transistor and a second E-mode transistor each having a source, a drain, a gate that controls a channel between the source and the drain, and a gate-source junction, wherein each E-mode transistor conducts between the source and the drain if a gate-source voltage that is applied between the gate and the source is more positive than a positive threshold voltage, and does not conduct between the source and the drain otherwise, a first D-mode transistor and a second D-mode transistor each having a source, a drain, a gate that controls a channel between the source and the drain, and a gate-source junction, wherein each D-mode transistor does not conduct between the source and the drain if a gate-source voltage that is applied between the gate and the source is more negative than a negative threshold voltage, and conducts between the source and the drain otherwise, a component that generates a voltage drop connected between the drain of the second E-mode transistor and the source of the second D-mode transistor, wherein the drain of the first E-mode transistor is connected to the source of the first D-mode transistor, wherein a feedback connection connects the drain of the second E-mode transistor to the gate of the second D-mode transistor, wherein the gate of the second D-mode transistor is connected to the gate of the first D-mode transistor, wherein the sources of the first and second E-mode transistors are coupled to a first voltage level supply voltage node, wherein the drains of the first and second D-mode transistors are coupled to a second voltage level supply voltage node, wherein the gate of the first E-mode transistor is coupled to an input signal node, and wherein the drain of the second E-mode transistor is coupled to an output signal node.

2. The circuit of claim 1, wherein the component that generates a voltage drop comprises a gate-source junction of a further E-mode transistor.

3. The circuit of claim 1, wherein the component that generates a voltage drop comprises at least two gate-source junctions of further E-mode transistors, the gate-source junctions being connected in series.

4. The circuit of claim 1, wherein the first and second E-node transistors and the first and second D-mode transistors are devices of a BiFET technology in GaAs.

5. The circuit of claim 1, further comprising:

a third D-mode transistor having a source, a drain, a gate that controls a channel between the source and the drain, and a gate-source junction, wherein the third D-mode transistor is not conducting between the source and the drain if a gate-source voltage that is applied between the gate and the source is more negative than a negative threshold voltage, and is conducting between the source and the drain otherwise, a second component that generates a voltage drop coupled between the gate of the second E-mode transistor and the source of the third D-mode transistor, and a feedback connection connecting the gate of the second E-mode transistor to the gate of the third D-mode transistor.

6. The circuit of claim 5, further comprising:

a current mirror comprising a third E-mode transistor and a further E-mode transistor, each having a source, a drain, a gate that controls a channel between the source and the drain, and a gate-source junction, each E-mode transistor conducting between the source and the drain if a gate-source voltage that is applied between the gate and the source is more positive than a positive threshold voltage, and not conducting between the source and the drain otherwise, wherein the source of the third E-mode transistor is coupled to the first voltage level supply voltage node, wherein the drain of the third E mode transistor is coupled to the sources of the first and second E-mode transistors, wherein the gate of the third E-mode transistor is coupled to the gate of the further E-mode transistor, wherein the gate of the further E-mode transistor is coupled to the drain of the further E-mode transistor, a fourth D-mode transistor having a source, a drain, a gate that controls a channel between the source and the drain, and a gate-source junction, the fourth D-mode transistor not conducting between the source and the drain if a gate-source voltage that is applied between the gate and the source is more negative than a negative threshold voltage, and conducting between the source and the drain otherwise, a component that generates a voltage drop coupled between the drain of the further E-mode transistor and the source of the fourth D-mode transistor, and a feedback connection connecting the drain of the further E-mode transistor to the gate of the fourth D-mode transistor.

7. The circuit of claim 6, wherein the drain of the further E-mode transistor is coupled to the gate of the fourth D-mode transistor via a second further E-mode transistor that has a gate-source junction and also has a gate and a drain that are short-circuited.

8. The circuit of claim 6, wherein the drain of the fourth D-mode transistor is coupled to a switchable voltage level provided to switch the input buffer on and off.

9. The circuit of claim 5, wherein the gate of the second E-mode transistor is coupled to a reference voltage node.

10. The circuit of claim 9, further comprising a component that generates the reference voltage coupled to the reference voltage node.

11. The circuit of claim 10, wherein the component that generates the reference voltage comprises a gate-source junction of an E-mode transistor having a source, a drain, and a gate that controls a channel between the source and the drain, the E-mode transistor conducting between the source and the drain if a gate-source voltage that is applied between the gate and the source is more positive than a positive threshold voltage, and not conducting between the source and the drain otherwise.

12. The circuit of claim 10, wherein the component that generates the reference voltage comprising gate-source junctions of at least two E-mode transistors, each having a source, a drain, and a gate that controls a channel between the source and the drain, the E-mode transistors each conducting between the source and the drain if a gate-source voltage that is applied between the gate and the source is more positive than a positive threshold voltage, and not conducting between the source and the drain otherwise, wherein the gate-source junctions are connected in series.

13. A low-current input buffer, comprising:

a current-limited differential entry stage comparing an input signal to a reference voltage, comprising:

a first E-mode transistor and a second E-mode transistor each having a source, a drain, a gate that controls a channel between the source and the drain, and a gate-source junction, each E-mode transistor conducting between the source and the drain if a gate-source voltage that is applied between the gate and the source is more positive than a positive threshold voltage, and not conducting between the source and the drain otherwise, a first D-mode transistor and a second D-mode transistor each having a source, a drain, a gate that controls a channel between the source and the drain, and a gate-source junction, each D-mode transistor not conducting between the source and the drain if a gate-source voltage that is applied between the gate and the source is more negative than a negative threshold voltage, and conducting between the source and the drain otherwise, a component that generates a voltage drop connected between the drain of the second E-mode transistor and the source of the second D-mode transistor, a feedback connection connecting the drain of the second E-mode transistor to the gate of the second D-mode transistor, wherein the drain of the first E-mode transistor is connected to the source of the first D-mode transistor, wherein the gate of the second D-mode transistor is connected to the gate of the first D-mode transistor, wherein the sources of the first and second E-mode transistors are to be connected to a first voltage level of a supply voltage, wherein the drains of the first and second D-mode transistors are to be connected to a second voltage level of the supply voltage, wherein the gate of the first E-mode transistor is provided for application of an input signal, and wherein the drain of the second E-mode transistor is provided for an output signal, a current-limited transistor or diode configuration generating the reference voltage at a reference voltage node, the configuration comprising:

a third D-mode transistor having a source, a drain, a gate that controls a channel between the source and the drain, and a gate-source junction, the third D-mode transistor not conducting between the source and the drain if a gate-source voltage that is applied between the gate and the source is more negative than a negative threshold voltage, and conducting between the source and the drain otherwise, a second component that generates a voltage drop connected between the reference voltage node and the source of the third D-mode transistor, a second feedback connection connecting the reference voltage node to the gate of the third D-mode transistor, and a connection between the reference voltage node and the gate of the second E-mode transistor.

14. The low-current input buffer of claim 13, wherein an output signal of the input buffer is provided to drive a high-impedance load.

15. The low-current input buffer of claim 14, wherein the high-impedance load comprises a depletion-mode FET or a depletion-mode P-HEMT.

16. The low-current input buffer of claim 13, further comprising a current-limited inverter circuit having an input, an output of the differential entry stage being connected to the input of the current-limited inverter circuit.

17. The low-current input buffer of claim 16, wherein the current-limited inverter circuit further comprises:

an input transistor and a feedback transistor, each having a source, a drain and a gate that controls a channel between the source and the drain, and a gate-source junction, wherein the input transistor conducts between the source and the drain if a gate-source voltage that is applied between the gate and the source is more positive than a positive threshold voltage, and does not conduct between the source and the drain otherwise, wherein the feedback transistor does not conduct between the source and the drain if a gate-source voltage that is applied between the gate and the source is more negative than a negative threshold voltage, and conducts between the source and the drain otherwise, a third component that generates a voltage drop between the source of the feedback transistor and the drain of the input transistor, a feedback connection between the drain of the input transistor and the gate of the feedback transistor, wherein the source of the input transistor is connected to the first voltage level supply voltage node, wherein the drain of the feedback transistor is connected to the second voltage level supply voltage node.

18. The low-current input buffer of claim 17, further comprising:

a further transistor, which is a bipolar transistor or a heterobipolar transistor, wherein the third component that generates a voltage drop comprises a diode of the further transistor.

19. The low-current input buffer of claim 13, wherein the configuration generating the reference voltage further comprises a gate-source junction of an E-mode transistor having a source, a drain, and a gate that is provided to control a channel between the source and the drain, the E-mode transistor conducting between the source and the drain if a gate-source voltage that is applied between the gate and the source is larger positive than a positive threshold voltage, and not conducting between the source and the drain else.

20. The low-current input buffer of claim 13, wherein the configuration generating the reference voltage further comprises gate-source junctions of at least two E-mode transistors having a source, a drain, and a gate that is provided to control a channel between the source and the drain, the E-mode transistors conducting between the source and the drain if a gate-source voltage that is applied between the gate and the source is larger positive than a positive threshold voltage, and not conducting between the source and the drain else, wherein the gate-source junctions are connected in series.

* * * * *